United States Patent [19]

Jones, III et al.

[11] Patent Number: 5,406,220
[45] Date of Patent: Apr. 11, 1995

[54] POLE/ZERO COMPENSATION IN CASCODE AMPLIFIERS

[75] Inventors: Robert S. Jones, III; Jeffrey D. Ganger, both of Austin, Tex.

[73] Assignee: Motorola Inc., Schaumburg, Ill.

[21] Appl. No.: 143,967

[22] Filed: Nov. 1, 1993

[51] Int. Cl.⁶ ............................................. H03F 3/45
[52] U.S. Cl. ..................................... 330/253; 330/292
[58] Field of Search ............... 330/253, 277, 292, 310; 307/494, 497

[56] References Cited

U.S. PATENT DOCUMENTS

| | | | |
|---|---|---|---|
| 4,484,148 | 11/1984 | Wieser et al. | 330/253 |
| 4,736,117 | 4/1988 | Wieser | 330/253 X |
| 4,737,732 | 4/1988 | Westwick | 330/261 |
| 5,089,789 | 2/1992 | Van Tran | 330/253 |
| 5,101,126 | 3/1992 | Butler et al. | 307/493 |
| 5,136,258 | 8/1992 | Nicollini et al. | 330/253 |
| 5,142,240 | 8/1992 | Isota et al. | 330/149 |
| 5,202,645 | 4/1993 | Phan et al. | 330/253 |
| 5,212,455 | 5/1993 | Pernici et al. | 330/253 |

OTHER PUBLICATIONS

Vadipour, "A New Compensation Technique for Resistive Level Shifters", IEEE Journal of Solid-State Circuits, vol. 28, No. 1, Jan. 1993, pp. 93–95.

*Primary Examiner*—Steven Mottola
*Attorney, Agent, or Firm*—Daniel D. Hill

[57] ABSTRACT

Compensation for a second pole located at an internal node (107 and 108) of a two pole cascode differential amplifier (30) is accomplished by introducing a left half plane zero in the transfer function of the cascode differential amplifier (30). This is done by coupling a compensation capacitor (46, 47) between an output node (105, 106) and the internal node (107, 108) of the cascode differential amplifier (30). The compensation capacitors (46, 47) improve high frequency performance of the amplifier (30) by improving phase margin and increasing stability.

5 Claims, 1 Drawing Sheet

POLE/ZERO COMPENSATION IN CASCODE AMPLIFIERS

FIELD OF THE INVENTION

This invention relates generally to cascode amplifiers, and more particularly, to pole/zero compensation in cascode amplifiers.

BACKGROUND OF THE INVENTION

FIG. 1 illustrates in schematic diagram form, prior art cascode differential amplifier 10. Cascode differential amplifier 10 includes P-channel transistors 12–15, 22, and 23, N-channel transistors 16–19, and current source 21. Cascode differential amplifier 10 has two symmetrical halves. The first symmetrical half includes P-channel transistors 12, 13, and 22, and N-channel transistors 16 and 17. The second symmetrical half includes P-channel transistors 14, 15, and 23, and N-channel transistors 18 and 19. In the first symmetrical half, P-channel transistor 22 has a source connected to relatively constant current source 21, and receives an input signal labeled "$V_{INP}$". A drain of P-channel transistor 22 is connected between N-channel transistors 16 and 17 at internal node 103. P-channel transistors 12 and 13 are series connected, and receive bias voltages labeled "$P_{B1}$" and "$P_{B2}$", respectively. Cascode connected N-channel transistors 16 and 17 received bias voltages labeled "$N_{B1}$" and "$N_{B2}$", respectively. A drain of P-channel transistor 13 is connected to a drain of N-channel transistor 16 at output node 101 for providing an output signal labeled "$V_{OUTM}$" to a load which includes load capacitance 24. In the second symmetrical half, P-channel transistor 23 has a source connected to relatively constant current source 21, and receives an input signal labeled "$V_{INM}$". A drain of P-channel transistor 23 is connected between N-channel transistors 18 and 19 at internal node 104. P-channel transistors 14 and 15 are series connected, and receive bias voltages $P_{B1}$ and $P_{B2}$, respectively. Cascode connected N-channel transistors 18 and 19 receives bias voltages $N_{B1}$ and $N_{B2}$, respectively. A drain of P-channel transistor 15 is connected to a drain of N-channel transistor 18 at output node 102 for providing an output signal labeled "$V_{OUTP}$" to a load which includes load capacitance 25. Input signals $V_{INP}$ and $V_{INM}$ are analog level differential input signals.

Prior art cascode differential amplifier 10 is commonly used as a voltage gain stage in a multi-stage operational amplifier (not shown). In addition, cascode differential amplifier 10 may be used as a building block for switched-capacitor integrators. In operation, prior art cascode differential amplifier 10 receives relatively weak, analog level, differential input signals $V_{INP}$ and $V_{INM}$, and in response, provides amplified differential output signals $V_{OUTM}$ and $V_{OUTP}$. Output nodes 101 and 102 are high impedance nodes, where a small change in current produces a large change in voltage. The dominant poles of cascode differential amplifier 10 are located at output nodes 101 and 102 and are determined by the capacitance of load capacitors 24 and 25.

Each of transistors 12–19, 22, and 23 are biased into the saturation region of operation. P-channel transistors 22 and 23 form a differential pair having their sources connected to current source 21, for receiving input signals $V_{INP}$ and $V_{INM}$. P-channel transistors 22 and 23 are connected as common-source amplifiers, and function to steer a current provided by current source 21 for amplifying the voltage of input signals $V_{INP}$ and $V_{INM}$. Input signal $V_{INP}$ is amplified in a phase opposite that of input signal $V_{INM}$. N-channel transistors 16 and 18 function as common-drain amplifiers and provide a second amplification of input signals $V_{INP}$ and $V_{INM}$ with zero phase shift. P-channel transistors 14 and 15, and N-channel transistors 18 and 19 are connected as cascode pairs, respectively, and function to reduce the conductance at output node 102. Likewise, P-channel transistors 12 and 13, and N-channel transistors 16 and 17 are connected as cascode pairs, respectively, and reduce the conductance at output node 101. The lower output conductance results in relatively high voltage gain at output: nodes 101 and 102. The conductance of P-channel transistors 22 and 23, in conjunction with the signal current division that occurs at nodes 103 and 104 also impacts the voltage gain of cascode differential amplifier 10. The signal current division is determined by the drain-source conductances of P-channel transistor 23 and N-channel transistor 19 in the second symmetrical half and by P-channel transistor 22 and N-channel transistor 17 in the first symmetrical half, as well as the conductance into the drain of N-channel transistors 16 and 18.

A problem with prior art cascode differential amplifier 10 is that a second pole exists at each of nodes 103 and 104. The second pole decreases the phase margin of prior art cascode differential amplifier 10 and may cause increased small signal settling time. Note that the phase margin is equal to 180 degrees minus the phase of an amplifier, when the amplifier is operating at the amplifier's unity gain frequency. In order for amplifier 10 to be useful, a phase margin of about 45 degrees or more is needed. The stability of prior art cascode differential amplifier 10 is related to the phase margin. Generally, increasing the phase margin results in a corresponding increase in stability.

For many applications, prior art differential amplifier 10 functions satisfactorily; however, in high frequency applications, the unity gain frequency may approach the position of the second pole, causing phase margin degradation. To allow operation at higher frequencies, the unity gain frequency of the second pole may be increased, by increasing the conductance and decreasing the capacitance at nodes 103 and 104. However, this may cause an undesirable reduction in voltage gain.

SUMMARY OF THE INVENTION

Accordingly, there is provided., in one form, a cascode amplifier stage, comprising first, second, and third transistors, and a capacitive element. The first transistor has a first current electrode for receiving a first current, a control electrode for receiving an input signal, and a second current electrode. The second transistor has a first current electrode for providing an output signal to an output node having a capacitive load, a control electrode for receiving a first bias voltage, and a second current electrode coupled to the second current electrode of the first transistor. The third transistor has a first current electrode coupled to the second current electrode of the second transistor, a control electrode for receiving a second bias voltage, and a second current electrode coupled to a first power supply voltage terminal. The capacitive element has a first plate electrode coupled to the first current electrode of the second transistor, and a second plate electrode coupled to the second current electrode of the first transistor, the capacitive element is for compensating for a pole at the second current electrode of the second transistor. These and other features and advantages will be more clearly understood from the following detailed description taken in conjunction with the accompanying drawings.

DESCRIPTION OF A PREFERRED EMBODIMENT

Figure 1:
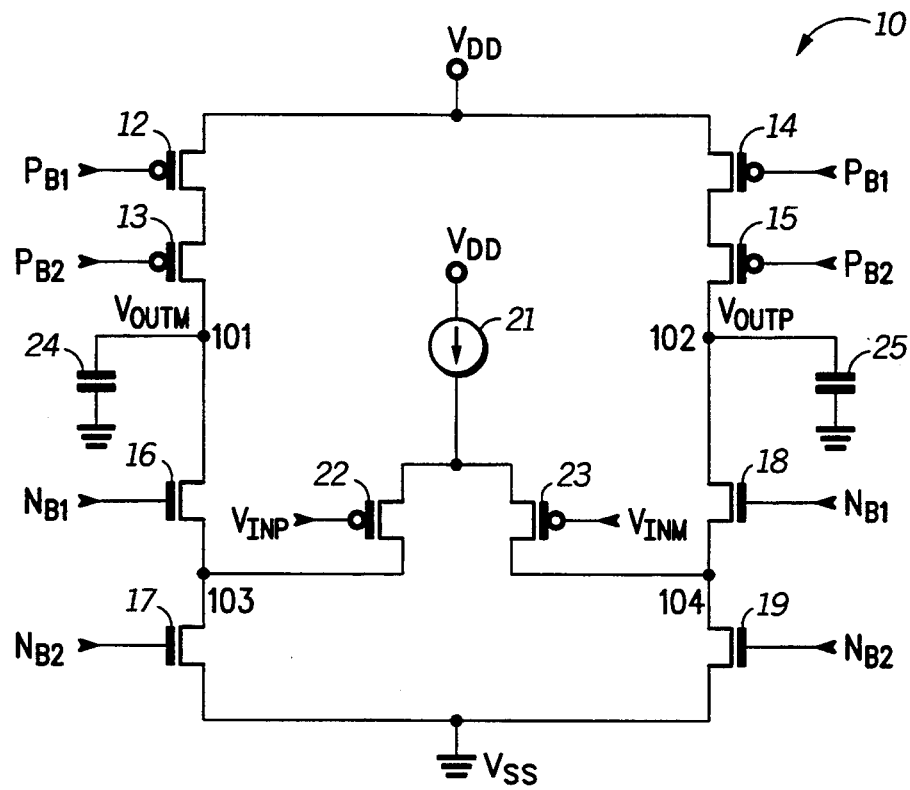
FIG. 1 illustrates in schematic diagram form, a prior art cascode differential amplifier.

Generally, the present invention provides pole/zero compensation for cascode amplifiers. This is accomplished by introducing a left half plane zero into the transfer function of two dominant pole cascode differential amplifier 30. This left half plane zero is used to partially cancel the second pole at node 108 by coupling capacitor 47 between nodes 106 and 108. The left half plane zero at node 107 is partially canceled by adding capacitor 46 between nodes 105 and 107. Using capacitors 46 and 47 to compensate for the second pole at nodes 107 and 108, respectively, is an efficient and economical technique for increasing the phase margin, and therefore the stability, of differential amplifier 30, without decreasing the voltage gain.

Figure 2:
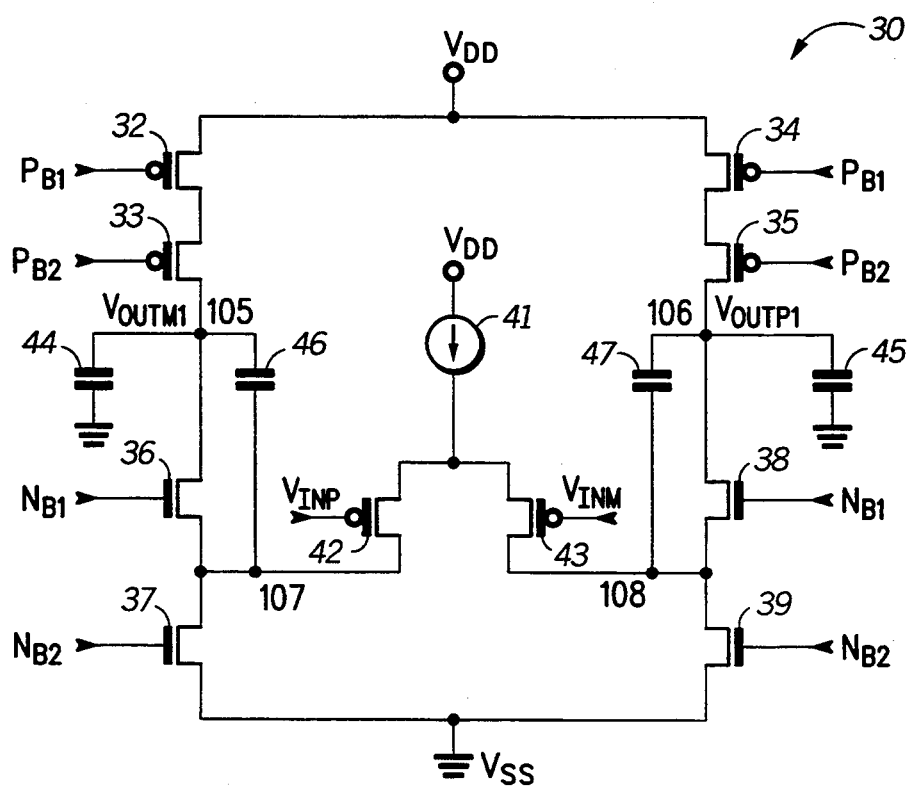
FIG. 2 illustrates in schematic diagram form, a cascode differential amplifier in accordance with the present invention.

The present invention can be more fully described with reference to FIG. 2. FIG. 2 illustrates in schematic diagram form, cascode differential amplifier 30 in accordance with the present invention. Cascode differential amplifier 30 is implemented in CMOS (complementary metal-oxide semiconductor) and includes P-channel transistors 32–35, 42 and 43, N-channel transistors 36–39, and current source 41. Cascode differential amplifier 30 has two symmetrical halves. The first symmetrical half includes P-channel transistors 32, 33, and 42, N-channel transistors 36, and 37, and compensation capacitor 46. The second symmetrical half includes P-channel transistors 34, 35, and 43, N-channel transistors 38 and 39, and compensation capacitor 47.

P-channel transistor 32 has a source connected to a positive power supply voltage terminal labeled "$V_{DD}$", a gate for receiving bias voltage $P_{B1}$, and a drain. P-channel transistor 33 has a source connected to the drain of P-channel transistor 32, a gate for receiving bias voltage $P_{B2}$, and a drain connected to output node 105. N-channel transistor 36 has a drain connected to the drain of P-channel transistor 33, a gate for receiving bias voltage $N_{B1}$, and a source connected to node 107 for providing: an output signal labeled "$V_{OUTM1}$". N-channel transistor 37 has a drain connected to the source of N-channel transistor 36, a gate for receiving bias voltage $N_{B2}$, and a source connected to a negative power supply voltage terminal labeled "$V_{SS}$". Compensation capacitor 46 has a first plate electrode connected to output node 105, and a second plate electrode connected to internal node 107. Current source 41 has a first terminal connected to $V_{DD}$, and a second terminal. P-channel transistor 42 has a source connected to the second[terminal of current source 41, a gate for receiving input signal $V_{INP}$, and a drain connected to node 107. P-channel transistor 34 has a source connected to $V_{DD}$, a gate for receiving bias voltage $P_{B1}$, and a drain. P-channel transistor 35 has a source connected to the drain of P-channel transistor 34, a gate for receiving bias voltage $P_{B2}$, and a drain connected to output node 106. N-channel transistor 38 has a drain connected to the drain of P-channel transistor 35 at output node 106 for providing output signal "$V_{OUTP1}$", a gate for receiving bias voltage $N_{B1}$, and a source. N-channel transistor 39 has a drain connected to the source of N-channel transistor 38 at internal node 108, a gate for receiving bias voltage $N_{B2}$, and a source connected to $V_{SS}$. Compensation capacitor 47 has a first plate electrode connected to output node 106, and a second plate electrode connected to node 108. Also shown in FIG. 2 is a capacitor 44 connected to output node 105 for representing a load capacitance, and a capacitor 45 connected to output node 106 for representing a load capacitance.

Input signals $V_{INP}$ and $V_{INM}$ are differential, analog level, input signals. Like prior art cascode differential amplifier 10, cascode differential amplifier 30 receives relatively weak input signals $V_{INP}$ and $V_{INM}$, and in response, provides amplified differential output signals $V_{OUTM1}$ and $V_{OUTP1}$. Cascode differential amplifier 30 is essentially the same as prior art cascode differential amplifier 10. However, in cascode differential amplifier 30, compensation capacitors 46 and 47 are used to generate left half plane zeros for canceling the second poles at nodes 107 and 108. The location of the left half plane zeros is chiefly determined by the conductance of N-channel transistors 36 and 38 as well as the capacitance of compensation capacitors 46 and 47. Thus, compensation capacitors 46 and 47 are sized such that the left half plane zeros compensate for the second poles at nodes 107 and 108, in order to improve the phase margin of cascode differential amplifier 30 without decreasing the voltage gain. Note that the second poles may not be completely canceled, since the second poles will become slightly dependent on the capacitance of compensation capacitors 46 and 47. Note that bias voltages $P_{B1}$, $P_{B2}$, $N_{B1}$, and $N_{B2}$ in cascode differential amplifier 30, are provided to bias transistors 32–39 into a saturation region of operation.

The compensation technique may also be used for increasing the phase margin of a two stage fully differential amplifier which includes differential amplifier 30 as a first stage. The second stage would include a CMOS common-source amplifier stage coupled to each of output nodes 105 and 106. The common-source amplifier stages would add a third pole to the transfer equation of the amplifier. And load capacitances 44 and 45 would be moved to the outputs of the CMOS common-source amplifier. With this topology, the problem with achieving sufficient phase margin is more difficult, because a three pole system is generally more difficult to stabilize than a two pole system. Yet, through use of feedforward blocking, RC pole splitting or replication, and/or pole/zero compensation, an amplifier with the desired DC voltage gain and phase margin may be developed.

Using compensation capacitors 46 and 47 to compensate for the second poles in cascode differential amplifier 30 provides the advantages of increased phase margin and improved stability of cascode differential amplifier 30 without reducing the DC voltage gain.

While the invention has been described in the context of a preferred embodiment, it will be apparent to those skilled in the art that the present invention may be modified in numerous ways and may assume many embodiments other than that specifically set out and described above. For example, cascode differential amplifier 30 may also be used as a single-ended cascode amplifier by providing a single-ended input signal to the gate of either P-channel transistor 42 and 43, and providing a reference voltage to the other gate. Also, the invention may be used to stabilize a fully differential amplifier composed of cascode differential amplifier 30 and a common-mode feedback amplifier, where the common-mode feedback amplifier is used to control a common-mode voltage of cascode differential amplifier 30. In addition, the conductivity types of the transistors, as well as the power supply voltage potentials may be reversed. Accordingly, it is intended by the appended claims to cover all modifications of the invention which fall within the true spirit and scope of the invention.

What is claimed is:

1. A CMOS cascode differential amplifier having pole compensation, comprising:

a current source having a first terminal coupled to a first power supply voltage terminal, and a second terminal;

a first transistor of a first conductivity type having a first current electrode coupled to the second terminal of the current source, a control electrode for receiving a first input signal, and a second current electrode coupled to a first node;

a second transistor of the first conductivity type having a first current electrode coupled to the second terminal of the current source, a control electrode for receiving a second input signal, and a second current electrode coupled to a second node;

a third transistor of the first conductivity type having a first current electrode coupled to the first power supply voltage terminal, a control electrode for receiving a first bias voltage, and a second current electrode;

a fourth transistor of the first conductivity type having a first current electrode coupled to the first power supply voltage terminal, a control electrode for receiving the first bias voltage, and a second current electrode;

a fifth transistor of the first conductivity type having a first current electrode coupled to the second current electrode of the third transistor, a control electrode for receiving a second bias voltage, and a second current electrode coupled to a first output node, the first output node coupled to a first capacitive load;

a sixth transistor of the first conductivity type having a first current electrode coupled to the second current electrode of the fourth transistor, a control electrode for receiving the second bias voltage, and a second current electrode coupled to a second output node, the second output node coupled to a second capacitive load;

a seventh transistor of a second conductivity type having a first current electrode coupled to the second current electrode of the fifth transistor at the first output node, a control electrode for receiving a third bias voltage, and a second current electrode coupled to the second current electrode of the first transistor at the first node;

an eighth transistor of the second conductivity type having a first current electrode coupled to the second current electrode of the sixth transistor at the second output node, a control electrode for receiving the third bias voltage, and a second current electrode coupled to the second current electrode of the second transistor at the second node;

a ninth transistor of the second conductivity type having a first current electrode coupled to the second current electrode of the seventh transistor at the first node, a control electrode for receiving a fourth bias voltage, and a second current electrode coupled to a second power supply voltage terminal;

a tenth transistor of the second conductivity type having a first current electrode coupled to the second current electrode of the eighth transistor at the second node, a control electrode for receiving the fourth bias voltage, and a second current electrode coupled to the second power supply voltage terminal;

a first compensation capacitor having a first plate electrode coupled to the first output node, and a second plate electrode coupled to the first node, the first compensation capacitor for compensating for a first pole at the first node; and a second compensation capacitor having a first plate electrode coupled to the second output node, and a second plate electrode coupled to the second node, the second compensation capacitor for compensating for a second pole at the second node.

2. The cascode differential amplifier of claim 1, wherein the first conductivity type is P-type and the second conductivity type is N-type.

3. The cascode differential amplifier of claim 1, wherein the first power supply voltage terminal is for receiving a positive power supply voltage, and the second power supply voltage terminal is for receiving a ground potential.

4. The cascode differential amplifier of claim 1, wherein the third, fourth, fifth, sixth, seventh, eighth, ninth, and tenth transistors are biased in a saturation region of operation.

5. The cascode differential amplifier of claim 1, wherein the first and second input signals are analog level, differential input signals.

* * * * *